United States Patent
Lee et al.

(10) Patent No.: US 7,847,592 B2
(45) Date of Patent: Dec. 7, 2010

(54) BUFFER CIRCUIT OF SEMICONDUCTOR MEMORY APPARATUS

(75) Inventors: Ji-Wang Lee, Gyeonggi-do (KR);
Yong-Ju Kim, Gyenoggi-Do (KR);
Sung-Woo Han, Gyeonggi-do (KR);
Hee-Woong Song, Gyeonggi-do (KR);
Ic-Su Oh, Gyeonggi-do (KR);
Hyung-Soo Kim, Gyeonggi-do (KR);
Tae-Jin Hwang, Gyeonggi-do (KR);
Hae-Rang Choi, Gyeonggi-do (KR);
Jae-Min Jang, Gyeonggi-do (KR);
Chang-Kun Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/494,757

(22) Filed: Jun. 30, 2009

(65) Prior Publication Data

US 2010/0039140 A1    Feb. 18, 2010

(30) Foreign Application Priority Data

Aug. 14, 2008    (KR) ...................... 10-2008-0079725

(51) Int. Cl.
*H03K 19/0175* (2006.01)
*H03K 19/0185* (2006.01)
(52) U.S. Cl. ........................... 326/68; 326/83; 327/109; 330/253

(58) Field of Classification Search .................. 326/68, 326/83; 327/109, 321, 543; 330/253
See application file for complete search history.

(56) References Cited

U.S. PATENT DOCUMENTS

| | | | |
|---|---|---|---|
| 6,788,101 | B1 | 9/2004 | Rahman |
| 7,020,031 | B2 | 3/2006 | Shin et al. |
| 7,317,338 | B2 | 1/2008 | Lee |
| 2005/0108468 | A1 | 5/2005 | Hazelzet et al. |
| 2005/0140442 | A1* | 6/2005 | Tan ............................ 330/253 |
| 2008/0057279 | A1 | 3/2008 | Fang |

FOREIGN PATENT DOCUMENTS

| | | |
|---|---|---|
| KR | 10-0338928 | 5/2002 |
| KR | 20-0276958 | 5/2002 |
| KR | 10-0369123 | 1/2003 |
| KR | 100422821 | 3/2004 |

* cited by examiner

*Primary Examiner*—Daniel D Chang
(74) *Attorney, Agent, or Firm*—Venable LLP; Jeffri A. Kaminski

(57) ABSTRACT

A buffer circuit of a semiconductor memory apparatus includes a buffering section configured to increase or decrease a voltage level of an output node by comparing a voltage level of an input signal with a voltage level of a reference voltage. A voltage compensation section applies a voltage to the output node in proportion to a variation of the reference voltage when the level of the reference voltage is lower than a target level.

14 Claims, 2 Drawing Sheets

BUFFER CIRCUIT OF SEMICONDUCTOR MEMORY APPARATUS

CROSS-REFERENCES TO RELATED PATENT APPLICATION

The present application claims priority under 35 U.S.C 119(a) to Korean Application No. 10-2008-0079725, filed on Aug. 14, 2008, in the Korean Intellectual Property Office, which is incorporated herein by reference in its entirety as set forth in full.

BACKGROUND

1. Technical Field

The embodiment described herein relates to a semiconductor memory apparatus and, more particularly, to a buffer circuit of the semiconductor memory apparatus.

2. Related Art

A general buffer circuit includes first to fifth transistors N1 to N3, P1, and P2 as shown in FIG. 1. The first transistor N1 is applied with a reference voltage 'Vref' at a gate thereof. The second transistor N2 receives an input signal 'in' at a gate thereof. The third transistor N3 is applied with a bias voltage 'Bias' at a gate thereof. A node that is connected to a source of the first transistor N1 and a source of the second transistor N2 is connected to a drain of the third transistor N3. A ground terminal VSS is connected to a source of the third transistor N3. The drain of the first transistor N1 is connected to a gate and a drain of the fourth transistor P1. The fourth transistor P1 is applied with an external voltage VDD at a source thereof. The gate of the fourth transistor P1 is connected to a gate of the fifth transistor P2 and the drain of the second transistor N2 is connected to a drain of the fifth transistor P2. The fifth transistor P2 is applied with the external voltage VDD at a source thereof. At this time, an output signal 'outb' is outputted from a node that is connected to the second transistor N2 and the fifth transistor P2.

The general buffer circuit having the above-mentioned structure has a disadvantage in that a noise of the reference voltage 'Vref' varies a swing level of the output signal 'outb'. Detailed description will be made below. When a voltage level of the reference voltage 'Vref' increases, a turn-on degree of the first transistor N1 increases, such that turn-on degrees of the fourth and fifth transistors P1 and P2 increase. Accordingly, a swing voltage level of the output signal 'outb' increases. If the input signal 'in' is a clock signal, the clock signal is outputted as a clock signal having a duty ratio different from a duty ratio of the input signal 'in' due to the increase in the swing voltage level of the output signal 'outb'. Further, when the voltage level of the reference voltage 'Vref' decreases, the swing voltage level of the output signal 'outb' decreases. Therefore, if the input signal 'in' is the clock signal, the clock signal is outputted as a clock signal having a duty ratio different from the duty ratio of the input signal 'in' due to the decrease of the swing voltage level of the output signal 'outb'.

SUMMARY

A buffer circuit of a semiconductor memory apparatus that can maintain a swing level of an output signal at a predetermined level irrespective of noise of a reference voltage is disclosed herein.

In one embodiment, a buffer circuit of a semiconductor memory apparatus includes a buffering section configured to increase or decrease a voltage level of an output node by comparing a voltage level of an input signal with a voltage level of a reference voltage; and a voltage compensation section configured to apply a voltage to the output node in proportion to a variation of the reference voltage when the level of the reference voltage is lower than a target level.

In another embodiment, a buffer circuit of a semiconductor memory apparatus includes a buffering section configured to decrease or increase a voltage level of an output node by comparing a voltage level of a reference voltage and a voltage level of an input signal; and a voltage compensation section configured to decrease the voltage level of the output node in proportion to a variation of the reference voltage when the reference voltage is higher than a target voltage.

In yet another embodiment, a buffer circuit of a semiconductor memory apparatus includes a buffering section configured to decrease or increase a voltage level of an output node by comparing a voltage level of an input signal with a voltage level of a reference voltage; and a voltage compensation section configured to apply a voltage to the output node or decrease a voltage level of the output node in response to the level of the reference voltage.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 2:
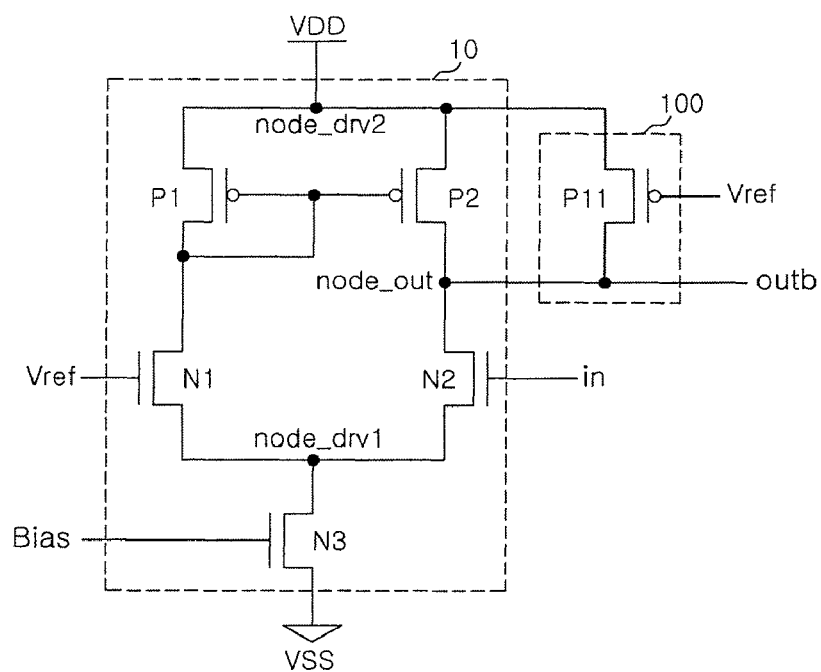
FIG. 2 is a configuration diagram of a buffer circuit of a semiconductor memory apparatus according to one embodiment.

A buffer circuit of a semiconductor memory apparatus according to one embodiment can be configured to include a buffering section 10 and a voltage compensation section 100 as shown in FIG. 2.

The buffering section 10 can decrease or increase a voltage level of an output node node_out to determine a level of an output signal 'outb' by comparing a voltage level of an input signal 'in' with a reference voltage 'Vref'. For example, the buffering section 10 can output the output signal 'outb' of a low level when the voltage level of the input signal 'in' is higher than the reference voltage 'Vref'. Meanwhile, the buffering section 10 can output the output signal 'outb' of a high level when the voltage level of the input signal 'in' is lower than the level of the reference voltage 'Vref'. At this time, the reference voltage 'Vref' is generated to detect the voltage level of the input signal 'in' and the voltage level of the reference voltage 'Vref' is generated at a target level which may be different levels based on the specific design.

The buffering section 10 can be configured to include first to fifth transistors N1 to N3, P1, and P2. The first transistor N1 is applied with the reference voltage 'Vref' at a gate thereof. A first driving node node_drv1 is connected to a source of the first transistor N1. The second transistor N2 receives the input signal 'in' at a gate thereof. The first driving node node_drv1 is connected to a source of the second transistor N2. The third transistor N3 is applied with a bias voltage 'Bias' at a gate thereof. The first driving node node_drv1 is connected to a drain of the third transistor N3 and a ground terminal VSS is connected to a source of the third transistor N3. A drain of the first transistor N1 is connected to a gate and a drain of the fourth transistor P1. A second driving node node_drv2 is connected to a source of the fourth transistor P1. The gate of the fourth transistor P1 is connected to a gate of the fifth transistor P2 and a drain of the second transistor N2 is connected to a drain of the fifth transistor P2. The second driving node node_drv2 is connected to a source of the fifth transistor P2. At this time, a node that is connected to the second transistor N2 and the fifth transistor P2 is an output node node_out and a voltage level of the output node node_out is outputted as a voltage level of the output signal 'outb'. Further, an external voltage VDD is applied to the second driving node node_drv2.

The voltage compensation section 100 can increase the voltage level of the output node node_out by applying a voltage to the output node node_out when the reference voltage 'Vref' is lower than the target level. At this time, the voltage compensation section 100 increases the voltage level applied to the output node node_out as the reference voltage 'Vref' is lower than the target level.

The voltage compensation section 100 can be configured to include a sixth transistor P11. The sixth transistor P11 is applied with the reference voltage 'Vref' at a gate thereof. The second driving node node_drv2 is connected to a source of the sixth transistor P11 and the output node node_out is connected to a drain of the sixth transistor P11.

An exemplary operation of the buffer circuit of the semiconductor memory apparatus according to one embodiment will be described below.

Figure 1:
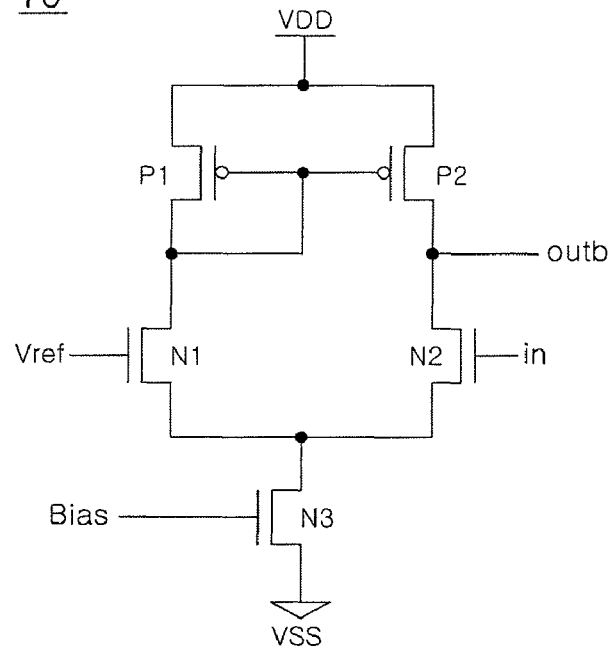
FIG. 1 is a detailed configuration diagram of a buffer circuit of a known semiconductor memory apparatus.

In the case of a known buffer circuit shown in FIG. 1, when a voltage level of an input signal 'in' is lower than a level of a reference voltage 'Vref', a first transistor N1 is turned on by the reference voltage 'Vref' and when the first transistor N1 is turned on, a fifth transistor P2 is turned on, such that an output signal 'outb' is generated at a high level. At this time, when a level of the reference voltage 'Vref' is lower than a target level, a turn-on degree of the first transistor N1 decreases and when the turn-on degree of the first transistor N1 decreases, a turn-on degree of the fifth transistor P2 decreases, such that a highest voltage level of the output signal 'outb' decreases.

However, in the case of the buffer circuit of the semiconductor memory apparatus according to one embodiment, as shown in FIG. 2, when a level of a reference voltage 'Vref' is lower than a target level, a voltage compensation section 100 may prevent a decrease in voltage level of an output node node_out by applying a voltage to the output node node_out. In the case of the buffer circuit of the semiconductor memory apparatus according to one embodiment, since a swing level of an output signal 'outb' does not vary, the semiconductor memory apparatus adopting the buffer circuit can perform a stable operation.

Figure 3:
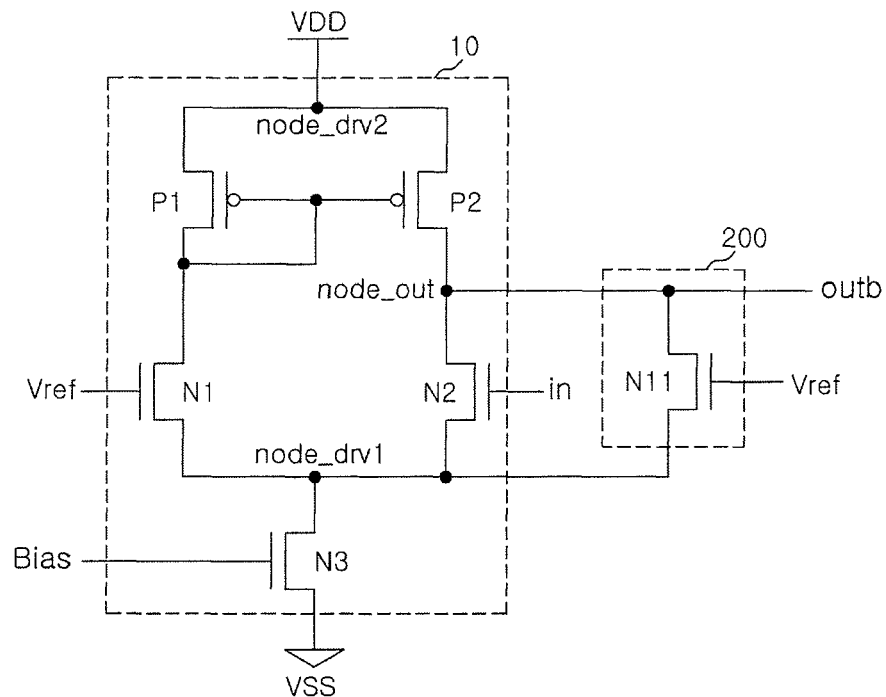
FIG. 3 is a configuration diagram of a buffer circuit of a semiconductor memory apparatus according to another embodiment.

A buffer circuit of a semiconductor memory apparatus according to another embodiment can be configured to include a buffering section 10 and a voltage compensation section 200 as shown in FIG. 3.

The buffering section 10 can be configured to include first to fifth transistors N1 to N3, P1, and P2. The first transistor N1 is applied with the reference voltage 'Vref' at a gate thereof. A first driving node node_drv1 is connected to a source of the first transistor N1. The second transistor N2 receives the input signal 'in' at a gate thereof. The first driving node node_drv1 is connected to a source of the second transistor N2. The third transistor N3 is applied with a bias voltage 'Bias' at a gate thereof. The first driving node node_drv1 is connected to a drain of the third transistor N3 and a ground terminal VSS is connected to a source of the third transistor N3. A drain of the first transistor N1 is connected to a gate and a drain of the fourth transistor P1. A second driving node node_drv2 is connected to a source of the fourth transistor P1. The gate of the fourth transistor P1 is connected to a gate of the fifth transistor P2 and a drain of the second transistor N2 is connected to a drain of the fifth transistor P2. The second driving node node_drv2 is connected to a source of the fifth transistor P2. At this time, a node that is connected to the second transistor N2 and the fifth transistor P2 is an output node node_out and a voltage level of the output node node_out is outputted as a voltage level of the output signal 'outb'. Further, an external voltage VDD is applied to the second driving node node_drv2.

The voltage compensation section 200 decreases the voltage level of the output node node_out when a level of the reference voltage 'Vref' is higher than a target level. At this time, the voltage compensation section 200 decreases voltage level of the output node node_out as the level of the reference voltage 'Vref' is higher than the target level.

The voltage compensation section 200 can be configured to include a sixth transistor N11. The sixth transistor N11 is applied with the reference voltage 'Vref' at a gate thereof. The output node node_out is connected to a drain of the sixth transistor N11 and the first driving node node_drv1 is connected to a source of the sixth transistor N11.

An exemplary operation of the buffer circuit of the semiconductor memory apparatus according to one embodiment will be described below.

In the case of the known buffer circuit shown in FIG. 1, when the voltage level of the input signal 'in' is lower than the level of the reference voltage 'Vref', the first transistor N1 is turned on by the reference voltage 'Vref' and when the first transistor N1 is turned on, the fifth transistor P2 is turned on, such that the output signal 'outb' is generated at a high level. At this time, when the level of the reference voltage 'Vref' is higher than the target level, the turn-on degree of the first transistor N1 increases and when the turn-on degree of the first transistor N1 increases, the turn-on degree of the fifth transistor P2 increases, such that the highest voltage level of the output signal 'outb' increases.

However, in the case of the buffer circuit of the semiconductor memory apparatus according to one embodiment, as shown in FIG. 3, when the level of a reference voltage 'Vref' is higher than the target level, the voltage compensation section 200 prevents an increase in the voltage level of the output node node_out by discharging the voltage level of the output node node_out. Accordingly, in the case of the buffer circuit of the semiconductor memory apparatus according to one embodiment, since a swing level of the output signal 'outb' does not vary, the semiconductor memory apparatus adopting the buffer circuit can perform a stable operation.

Figure 4:
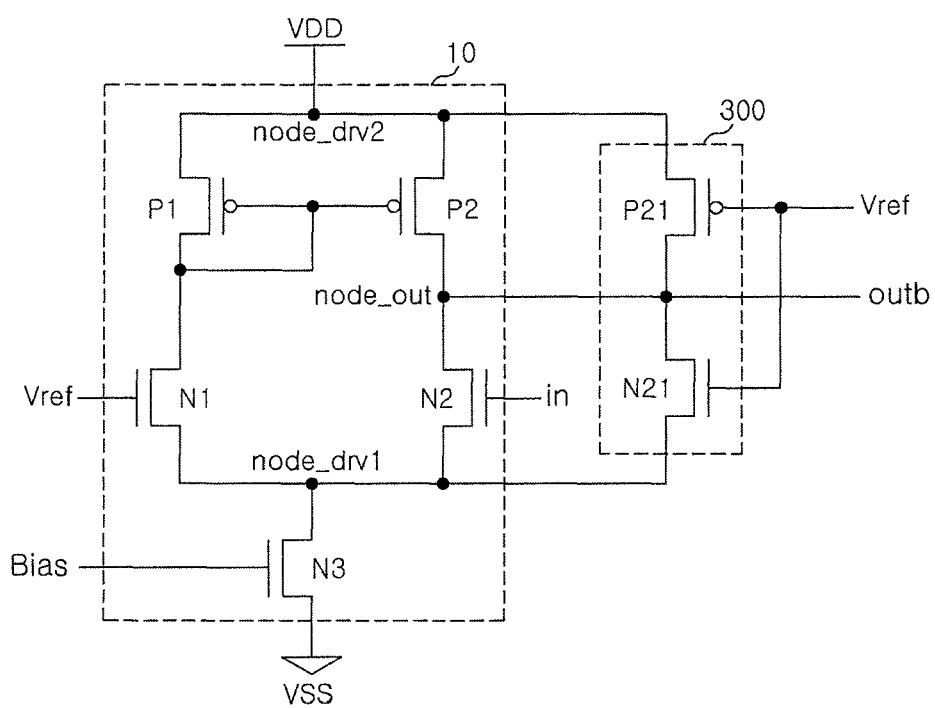
FIG. 4 is a configuration diagram of a buffer circuit of a semiconductor memory apparatus according to yet another embodiment.

A buffer circuit of a semiconductor memory apparatus according to yet another embodiment can be configured to include a buffering section 10 and a voltage compensation section 300 as shown in FIG. 4.

The buffering section 10 can be configured to include first to fifth transistors N1 to N3, P1, and P2. The first transistor N1 is applied with the reference voltage 'Vref' at a gate thereof. A first driving node node_drv1 is connected to a source of the first transistor N1. The second transistor N2 receives the input signal 'in' at a gate thereof. The first driving node node_drv1 is connected to a source of the second transistor N2. The third transistor N3 is applied with a bias voltage 'Bias' at a gate thereof. The first driving node node_drv1 is connected to a drain of the third transistor N3 and a ground terminal VSS is connected to a source of the third transistor N3. A drain of the first transistor N1 is connected to a gate and a drain of the fourth transistor P1. A second driving node node_drv2 is connected to a source of the fourth transistor P1. The gate of the fourth transistor P1 is connected to a gate of the fifth transistor P2 and a drain of the second transistor N2 is connected to a drain of the fifth transistor P2. The second driving node node_drv2 is connected to a source of the fifth transistor P2. At this time, a node that is connected to the second transistor N2 and the fifth transistor P2 is an output node node_out and a voltage level of the output node node_out is outputted as a voltage level of the output signal 'outb'. Further, an external voltage VDD is applied to the second driving node node_drv2.

When a level of the reference voltage 'Vref' is lower than a target level, the voltage compensation section 300 prevents a decrease in the voltage level of the output node node_out by applying a voltage to the output node node_out and when the level of the reference voltage 'Vref' is higher than the target level, the voltage compensation section 300 prevents an increase in the voltage level of the output node node_out by decreasing the voltage level of the output node node_out. At this time, the voltage compensation section 300 increases the voltage level applied to the output node node-out as the level of the reference voltage 'Vref' is lower than the target level and decreases voltage level of the output node node_out as the level of the reference voltage 'Vref' is higher than the target level.

The voltage compensation section 300 can be configured to include sixth and seventh transistors P21 and N21. The sixth transistor P21 is applied with the reference voltage 'Vref' at a gate thereof. The output node node_out is connected to a drain of the sixth transistor P21 and the second driving node node_drv2 is connected to a source of the sixth transistor P21. The seventh transistor N21 is applied with the reference voltage 'Vref' at a gate thereof. The output node node_out is connected to a drain of the seventh transistor N21 and the first driving node node_drv1 is connected to a source of the seventh transistor N21.

An exemplary operation of the buffer circuit of the semiconductor memory apparatus will be described below.

In the case of the known buffer circuit shown in FIG. 1, when a level of a reference voltage 'Vref' is lower than a target level, a turn-on degree of a first transistor N1 decreases and when the turn-on degree of the first transistor N1 decreases, a turn-on degree of a fifth transistor P2 decreases, such that a highest voltage level of an output signal 'outb' decreases. Further, in the case of the known buffer circuit, when the level of the reference voltage 'Vref' is higher than the target level, the turn-on degree of the first transistor N1 increases and when the turn-on degree of the first transistor N1 increases, the turn-on degree of the fifth transistor P2 increases, such that the highest voltage level of the output signal 'outb' increases.

However, in the case of the buffer circuit of the semiconductor memory apparatus according to one embodiment, as shown in FIG. 4, when a level of a reference voltage 'Vref' is lower than a target level, a voltage compensation section 300 prevents a decrease in a voltage level of an output node node_out by applying a voltage to the output node node_out. Further, when the level of the reference voltage 'Vref' is higher than the target level, the voltage compensation section 300 prevents an increase in the voltage level of the output node node-out by decreasing the voltage level of the output node node_out. Accordingly, in the case of the buffer circuit of the semiconductor memory apparatus according to one embodiment, since a swing level of the output signal 'outb' does not vary, the semiconductor memory apparatus adopting the buffer circuit can perform a stable operation.

While certain embodiments have been described above, it will be understood to those skilled in the art that the embodiments described are by way of example only. Accordingly, the device and method described herein should not be limited based on the described embodiments. Rather, the apparatus described herein should only be limited in light of the claims that follow when taken in conjunction with the above description and accompanying drawings.

What is claimed is:

1. A buffer circuit of a semiconductor memory apparatus, comprising:
   a buffering section configured to increase or decrease a voltage level of an output node by comparing a voltage level of an input signal with a voltage level of a reference voltage; and
   a voltage compensation section configured to apply a voltage to the output node in proportion to a variation of the reference voltage when the voltage level of the reference voltage is lower than a target level,
   wherein the voltage compensation section applies the voltage to the output node that outputs an output signal of the buffer circuit in response to the reference voltage regardless of the voltage level of the output node.

2. The buffer circuit of claim 1, wherein the voltage compensation section comprises a transistor that is applied with the reference voltage at a gate thereof and a driving voltage at a source thereof and a drain thereof is connected to the output node.

3. A buffer circuit of a semiconductor memory apparatus, comprising:
   a buffering section configured to decrease or increase a voltage level of an output node by comparing a voltage level of a reference voltage and a voltage level of an input signal; and
   a voltage compensation section configured to decrease the voltage level of the output node in proportion to a variation of the reference voltage when the reference voltage is higher than a target level,
   wherein the voltage compensation section decreases the voltage level of the output node that outputs an output signal of the buffer circuit in response to the reference voltage regardless of the voltage level of the output node.

4. The buffer circuit of claim 3, wherein the voltage compensation section includes a transistor that is applied with the reference voltage at a gate thereof and a drain thereof is connected to the output node and a source thereof is connected to a ground terminal.

5. The buffer circuit of claim 3, wherein the voltage compensation section includes:
   a first transistor configured to be applied with the reference voltage at a gate thereof, a drain thereof is connected to the output node; and
   a second transistor configured to be applied with a bias voltage at a gate thereof, a drain thereof is connected to a source of the first transistor and a source of the second transistor is connected to a ground terminal.

6. A buffer circuit of a semiconductor memory apparatus, comprising:
   a buffering section configured to decrease or increase a voltage level of an output node by comparing a voltage level of an input signal with a voltage level of a reference voltage; and a voltage compensation section configured to apply a voltage to the output node or decrease a voltage level of the output node in response to the voltage level of the reference voltage, wherein the voltage compensation section applies the voltage to the output node or decreases the voltage level of the output node that outputs an output signal of the buffer circuit in response to the reference voltage regardless of the voltage level of the output node.

7. The buffer circuit of claim 6, wherein the voltage compensation section is configured to apply the voltage to the output node in proportion to a variation of the reference voltage when the reference voltage is lower than a target level and decrease the voltage level of the output node in proportion to the variation of the reference voltage when the reference voltage is higher than the target level.

8. The buffer circuit of claim 7, wherein the voltage compensation section includes:
   a first transistor configured to be applied with the reference voltage at a gate thereof and a driving voltage at a source thereof, a drain thereof is connected to the output node; and
   a second transistor configured to be applied with the reference voltage at a gate thereof, a drain thereof is connected to the output node and a source thereof is connected to a ground terminal.

9. The buffer circuit of claim 8, wherein the buffering section includes a first driving node and a second driving node, and
   wherein the second driving node is configured to be applied to an external voltage and the first driving node is configured to allow a predetermined amount of current to flow to the ground terminal.

10. The buffer circuit of claim 9, wherein the voltage compensation section includes:
    a first transistor configured to be applied with the reference voltage at a gate thereof, a source thereof is connected to the second driving node and a drain thereof is connected to the output node; and
    a second transistor configured to be applied with the reference voltage at a gate thereof, a drain thereof is connected to the output node and a source thereof is connected to the first driving node.

11. The buffer circuit of claim 6, wherein the voltage compensation section is configured to apply the voltage to the output node in proportion to a variation of the reference voltage when the reference voltage is lower than a target level.

12. The buffer circuit of claim 11, wherein the voltage compensation section includes a transistor configured to be applied with the reference voltage at a gate thereof and a driving voltage at a source thereof, a drain thereof is connected to the output node.

13. The buffer circuit of claim 6, wherein the voltage compensation section is configured to decrease the voltage level of the output node in proportion to the variation of the reference voltage when the reference voltage is higher than a target level.

14. The buffer circuit of claim 13, wherein the voltage compensation section includes a transistor configured to be applied with the reference voltage at a gate thereof, a drain thereof is connected to the output node and a source thereof is connected to a ground terminal.

* * * * *